(12) United States Patent
Deriso et al.

(10) Patent No.: US 10,900,919 B2
(45) Date of Patent: Jan. 26, 2021

(54) MICROWAVE CAVITY FOR PERMITTIVITY MEASUREMENTS

(71) Applicant: SKYWORKS SOLUTIONS, INC., Woburn, MA (US)

(72) Inventors: John Christopher Deriso, Herndon, VA (US); Brian Christopher Eiker, Thurmont, MD (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 165 days.

(21) Appl. No.: 15/894,015

(22) Filed: Feb. 12, 2018

(65) Prior Publication Data

US 2018/0231480 A1 Aug. 16, 2018

Related U.S. Application Data

(60) Provisional application No. 62/458,341, filed on Feb. 13, 2017.

(51) Int. Cl.
*G01N 27/02* (2006.01)
*H01R 13/622* (2006.01)
*H01R 13/639* (2006.01)
*G01R 27/26* (2006.01)
*H01P 7/06* (2006.01)

(52) U.S. Cl.
CPC ......... *G01N 27/02* (2013.01); *G01R 27/2664* (2013.01); *H01P 7/06* (2013.01); *H01R 13/622* (2013.01); *H01R 13/639* (2013.01)

(58) Field of Classification Search
CPC .......... H01P 7/06; H01P 7/065; H01R 13/62; H01R 13/622; H01R 13/639; G01N 27/02; G01R 27/02; G01R 27/26; G01R 27/2688

See application file for complete search history.

(56) References Cited

U.S. PATENT DOCUMENTS

| | | | | | |
|---|---|---|---|---|---|
| 4,746,883 | A | * | 5/1988 | Sauvage | H01P 1/205 333/202 |
| 4,780,692 | A | * | 10/1988 | Kiedrowski | H01P 1/12 333/108 |
| 5,554,935 | A | * | 9/1996 | Kraszewski | G01G 3/16 324/633 |
| 5,854,559 | A | * | 12/1998 | Miranda | G01R 1/04 324/750.02 |
| 6,691,563 | B1 | * | 2/2004 | Trabelsi | G01N 22/04 324/640 |

(Continued)

*Primary Examiner* — Huy Q Phan
*Assistant Examiner* — David B Frederiksen
(74) *Attorney, Agent, or Firm* — Lando & Anastasi, LLP

(57) ABSTRACT

An apparatus for perturbation method electrical permittivity measurements of a sample comprises a waveguide body having a first end, a second end, an upper wall, and a lower wall, a first shorting plug disposed within the waveguide body proximate the first end, a second shorting plug disposed within the waveguide body proximate the second end, a first threaded connector mount attached to the upper wall of the waveguide body at a first position along a length of the waveguide body, a second threaded connector mount attached to the upper wall of the waveguide body at a second position along a length of the waveguide body, and first and second apertures formed centrally in the upper wall and lower wall, respectively, of the waveguide body.

20 Claims, 7 Drawing Sheets

(56) References Cited

U.S. PATENT DOCUMENTS

| | | | |
|---|---|---|---|
| 6,864,690 B1* | 3/2005 | Tidrow | G01R 27/2658 324/636 |
| 9,773,587 B1* | 9/2017 | Gregoire | G01R 33/12 |
| 2004/0207494 A1* | 10/2004 | Brown | H01P 1/208 333/209 |
| 2005/0150278 A1* | 7/2005 | Troxler | G01N 22/00 73/78 |
| 2007/0090846 A1* | 4/2007 | Habashy | G01R 27/2647 324/600 |
| 2008/0303613 A1* | 12/2008 | Lau | H01P 1/042 333/254 |
| 2010/0121318 A1* | 5/2010 | Hancock | A61B 18/18 606/33 |
| 2011/0057741 A1* | 3/2011 | Dayan | H01P 5/107 333/26 |
| 2014/0184230 A1* | 7/2014 | Anderson | E21B 49/00 324/376 |
| 2014/0361791 A1* | 12/2014 | Park | G01R 27/2658 324/636 |
| 2015/0263401 A1* | 9/2015 | Kawamura | H01P 7/06 333/209 |
| 2016/0033422 A1* | 2/2016 | Vaisman | G01N 22/00 324/633 |
| 2016/0187402 A1* | 6/2016 | Roelvink | G01N 22/00 324/601 |

* cited by examiner

MICROWAVE CAVITY FOR PERMITTIVITY MEASUREMENTS

CROSS REFERENCE TO RELATED APPLICATIONS

This application claims priority under 35 USC § 119(e) to U.S. provisional patent application Ser. No. 62/458,341, titled "MICROWAVE CAVITY FOR PERMITTIVITY MEASUREMENTS," filed Feb. 13, 2017, which is incorporated by reference herein in its entirety for all purposes.

BACKGROUND

Field of Invention

The present invention relates generally to systems and methods for measuring electrical permittivity of a material sample. More particularly, at least some embodiments are directed to a microwave cavity assembly used in the measurements of electrical permittivity of material samples.

Discussion of Related Art

FIG. 4 of "ASTM D2520-13 TEST METHOD B—RESONANT CAVITY PERTUBATION METHOD," reproduced herein as FIG. 1A, illustrates a rectangular microwave cavity for permittivity measurements by the perturbation method disclosed in this standard. The permittivity measurement is performed by first measuring the resonant frequency and quality factor (Q) of the microwave cavity and then inserting a test specimen into the microwave cavity and observing how the resonant frequency and Q value change. The permittivity of the test sample may be determined from the observed change in resonant frequency and Q value per equations described in the ASTM D2520-13 standard. The test specimen is a rod of, for example, a dielectric or ferrite material. The cavity illustrated is a waveguide bounded at each end by a waveguide flange, and an end plate configured with an iris hole. The interior dimensions of the waveguide determine the resonant frequency of the cavity. The iris hole diameter determines the degree of coupling to external test equipment and cannot be adjusted to change the coupling without cavity disassembly and changing or modifying end plates. Electrical connections to test equipment require waveguide-to-coaxial cable connections, examples of which are illustrated in FIG. 1B. These transitions, and the custom end plates with iris holes, must be rigidly bolted to the cavity for proper operation. Any misalignment deteriorates electrical contact, degrades cavity quality factor, and limits measurement precision. Measurement repeatability also suffers if the assembly is dissembled, for example, for cleaning, and reassembled in a manner that differs even slightly from a previously assembled state. The ASTM D2520-13 test method has been used since at least 1990 or earlier with no improvements.

SUMMARY OF INVENTION

According to one aspect of the present invention there is provided an apparatus for perturbation method electrical permittivity measurements of a sample. The apparatus comprises a waveguide body having a first end, a second end, an upper wall, and a lower wall, a first shorting plug disposed within the waveguide body proximate the first end, a second shorting plug disposed within the waveguide body proximate the second end, a first threaded connector mount attached to the upper wall of the waveguide body at a first position along a length of the waveguide body, a second threaded connector mount attached to the upper wall of the waveguide body at a second position along a length of the waveguide body, and first and second apertures formed centrally in the upper wall and lower wall, respectively, of the waveguide body.

In some embodiments, the first and second shorting plugs include shoulder portions extending outward from an internal region of the waveguide body and abutting against the first and second ends, respectively, of the waveguide body. The first and second shorting plugs may include end faces including first outwardly protruding lips, second outwardly protruding lips abutting the shoulder portions, and reduced height portions defined between the first outwardly protruding lips and second outwardly protruding lips. The first and second shorting plugs may include apertures defined in the reduced height portions sized to receive bolts to hold the first and second shorting plugs in place in the waveguide body.

In some embodiments, the waveguide body and the first and second shorting plugs define a resonant cavity within the waveguide body, the resonant cavity sized and shaped to support a third harmonic standing wave having electric field energy minimums at end faces of the shorting plugs and electric field energy maximums at positions within the waveguide body corresponding to the first threaded connector mount, the second threaded connector mount, and the first and second apertures.

In some embodiments, the first and second threaded connector mounts are configured to receive and retain SMA (SubMiniature version A) connectors. The apparatus may further comprise locking nuts configured to maintain the SMA connectors in place within the first and second threaded connector mounts. Rotation of the SMA connectors within the first and second threaded connector mounts may cause the SMA connectors to be displaced within the first and second threaded connector mounts, displacement of the SMA connectors within the first and second threaded connector mounts altering a cavity insertion loss of the SMA connectors.

In some embodiments, the waveguide body is formed of copper.

In some embodiments, the first and second shorting plugs are formed of brass.

In some embodiments, the first and second threaded connector mounts are formed of brass.

In some embodiments, surfaces of a resonant cavity defined by internal walls of the waveguide body and end faces of the first and second shorting plugs is silver plated.

In some embodiments, the waveguide body has a rectangular cross section.

In some embodiments, the apparatus has a quality factor of above 7,000 at 9.36 GHz.

In accordance with another aspect, there is provided a method for measuring the electrical permittivity of a sample. The method comprises measuring the Q value and resonant frequency of an empty waveguide assembly. The waveguide assembly includes a waveguide body having a first end, a second end, an upper wall, and a lower wall, a first shorting plug disposed within the waveguide body proximate the first end, a second shorting plug disposed within the waveguide body proximate the second end, a first threaded connector mount attached to the upper wall of the waveguide body at a first position along a length of the waveguide body, a second threaded connector mount attached to the upper wall of the waveguide body at a second position along a length of the waveguide body, and first and second apertures formed centrally in the upper wall and lower wall, respectively, of the waveguide body. The method further includes inserting at least a portion of the sample through one or both of the first and second apertures and into an internal volume of the waveguide body, measuring the Q value and resonant frequency of the waveguide assembly with the sample disposed therein, and calculating the electrical permittivity of the sample from the Q value and resonant frequency of the empty waveguide assembly and the Q value and resonant frequency of the waveguide assembly with the sample disposed therein.

In some embodiments, the method further comprises mounting a first electrical connector in the first threaded connector mount and mounting a second electrical connector in the second threaded connector mount.

In some embodiments, the method further comprises adjusting a degree of electrical coupling between the first and second electrical connectors and the waveguide assembly by adjusting a degree to which the first and second electrical connectors are screwed into the first threaded connector mount and second threaded connector mount, respectively.

In some embodiments, the method further comprises locking the first and second electrical connectors in place in the first threaded connector mount and second threaded connector mount, respectively with lock nuts.

In some embodiments, measuring the Q value and resonant frequency of the waveguide assembly includes introducing microwave energy into the waveguide assembly via the first and second electrical connectors.

In some embodiments, the method further comprises selecting a frequency of the microwave energy that creates a third harmonic standing wave with electric field energy minimums at innermost faces of the shorting plugs and electric field energy maximums at lengths along the waveguide body corresponding to centers of the first and second threaded connector mounts and the first and second apertures.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Various aspects and embodiments disclosed herein relate to an improved microwave cavity assembly for permittivity measurements of a material sample that does not suffer from the disadvantages of the prior art, which is mechanically simpler, and which offers the user more flexibility in testing methodology and procedures than do conventional microwave cavity assemblies.

In apparatus and methods for the measurement of electrical permittivity (also referred to herein as "dielectric constant") of material samples, for example, dielectric or ferrite material samples, it may be desired to provide for adjustment of electrical coupling between the test apparatus and measurement apparatus for some test specimens, for example, when the sample causes high losses in microwave energy when disposed in the measurement apparatus. High loss materials, such as those with loss tangents of 0.002 or more, tend to give insufficient response to provide accurate measurement results for electrical permittivity when tested in a microwave cavity having a "light" coupling of, for example, 35 dB, to measurement equipment, for example, a vector network analyzer (VNA). Tightening the electrical coupling to, for example, about 25 dB, may allow the VNA to read a signal that is sufficiently strong to provide for the accurate measurement of electrical permittivity of high loss materials. Too tight an electrical coupling (a low dB value) between the test apparatus and measurement apparatus, however, may be undesirable because it may lead to inaccurate electrical permittivity measurement results. The equations that are generally used to determine the electrical permittivity of a test specimen by the perturbation method discussed above lose accuracy when the coupling between the test apparatus and measurement apparatus is too tight. Accordingly, the coupling between the test apparatus and measurement apparatus should be maintained in a range of from about 25 dB to about 35 dB, or about 30 dB for most samples.

Further, in some implementations it has been found desirable that a microwave cavity for permittivity measurements by the perturbation method as disclosed in "ASTM D2520-13 TEST METHOD B—RESONANT CAVITY PERTUBATION METHOD" be provided with a higher quality factor (Q) value than the microwave cavity described in this standard. As the Q value of a microwave cavity for permittivity measurements by the perturbation method increases, so does the accuracy of the permittivity measurements.

Figure 1A:
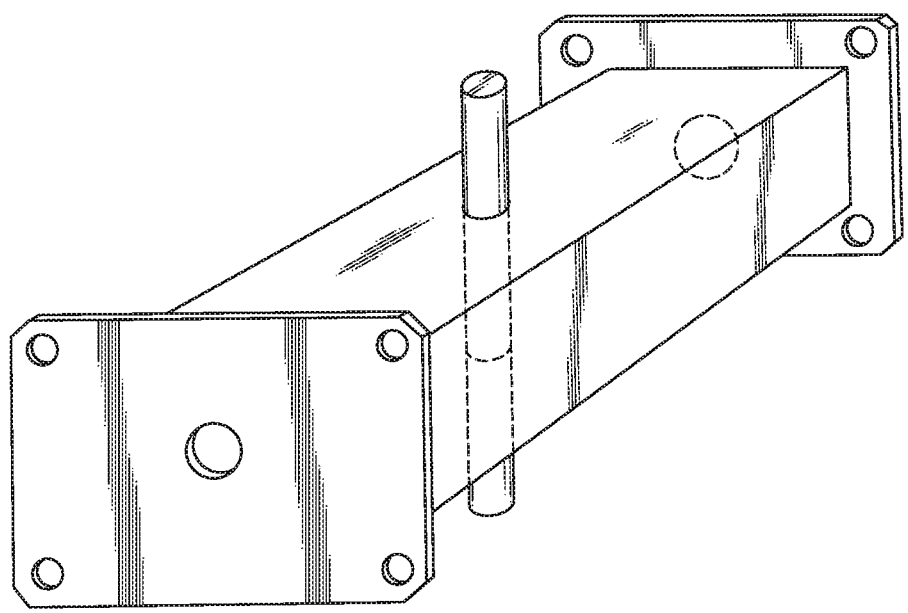
FIG. 1A is an isometric view of a conventional microwave cavity for measurements of electrical permittivity of a sample by a perturbation method.
Figure 1B:
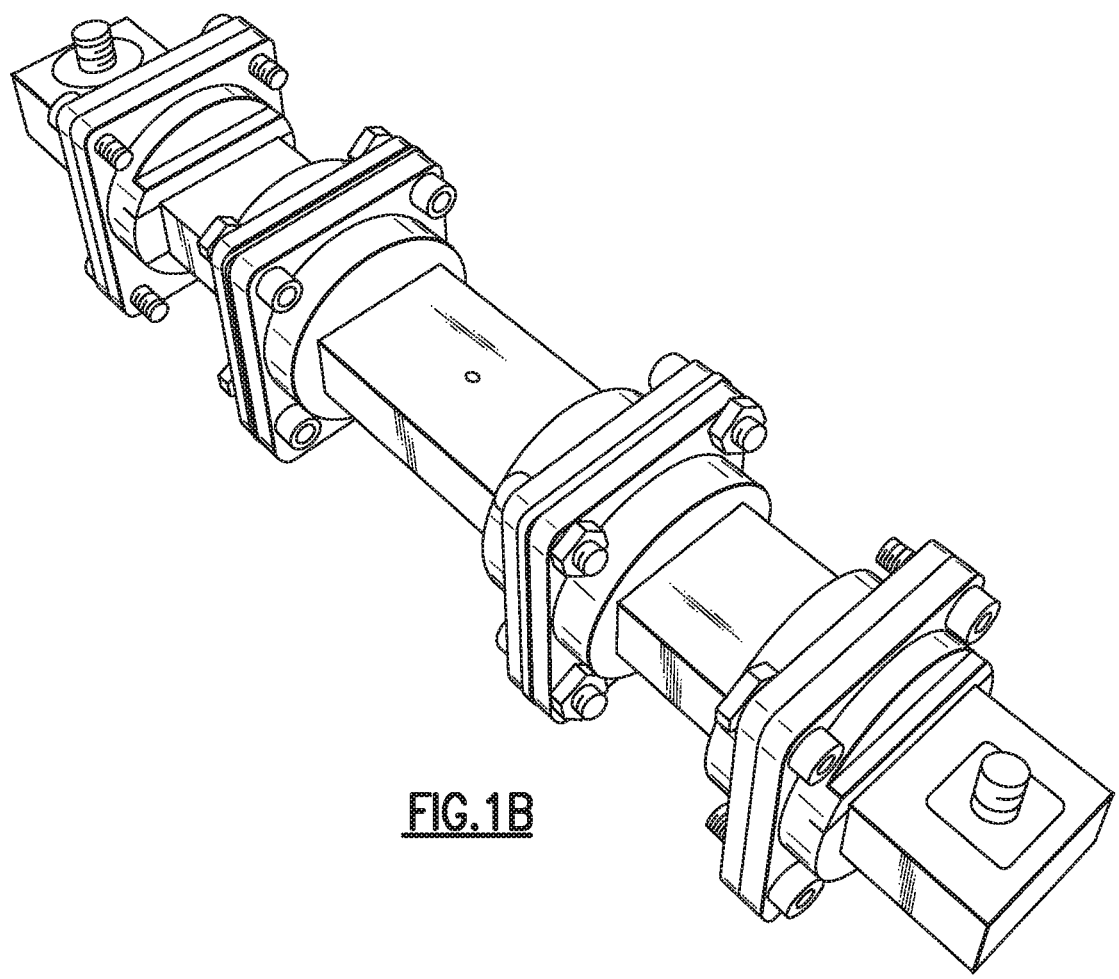
FIG. 1B is an image of a microwave cavity substantially as illustrated in FIG. 1A with waveguide-to-coaxial cable connections attached.
Figure 2:
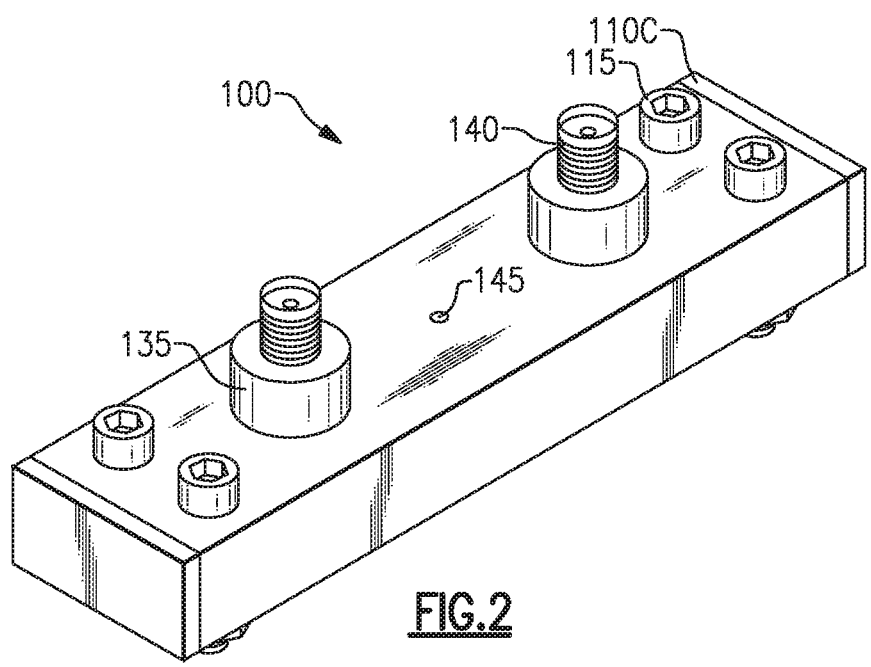
FIG. 2 is an isometric view of an embodiment of a microwave cavity assembly for measurements of electrical permittivity of a sample.
Figure 3:
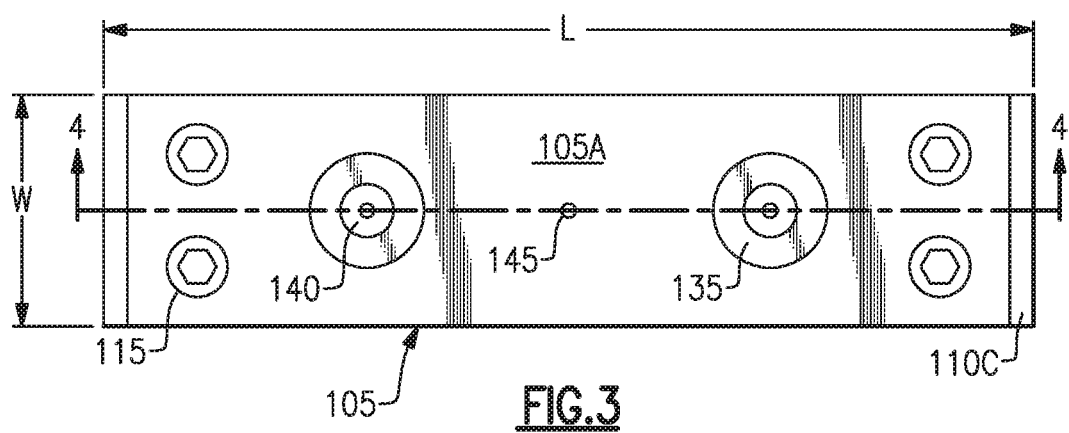
FIG. 3 is a plan view the top side of the microwave cavity assembly of FIG. 2.
Figure 4:
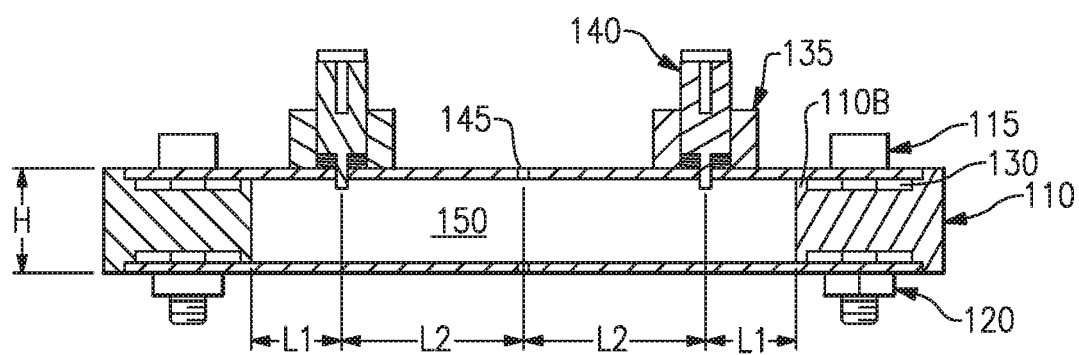
FIG. 4 is a cross-sectional view of the microwave cavity assembly of FIG. 2 taken along line 4-4 of FIG. 3.
Figure 5:
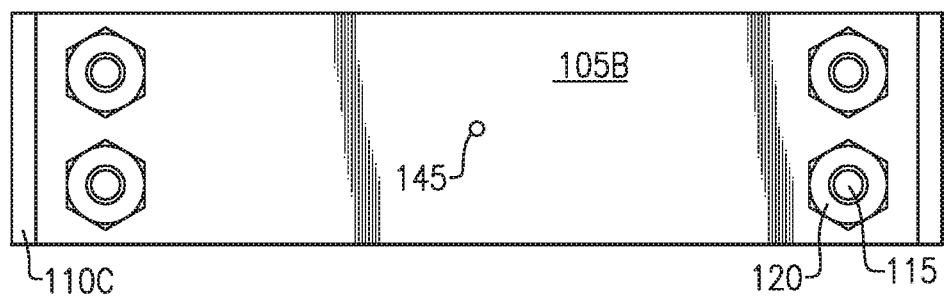
FIG. 5 is a plan view of bottom side of the microwave cavity assembly of FIG. 2.
Figure 6A:
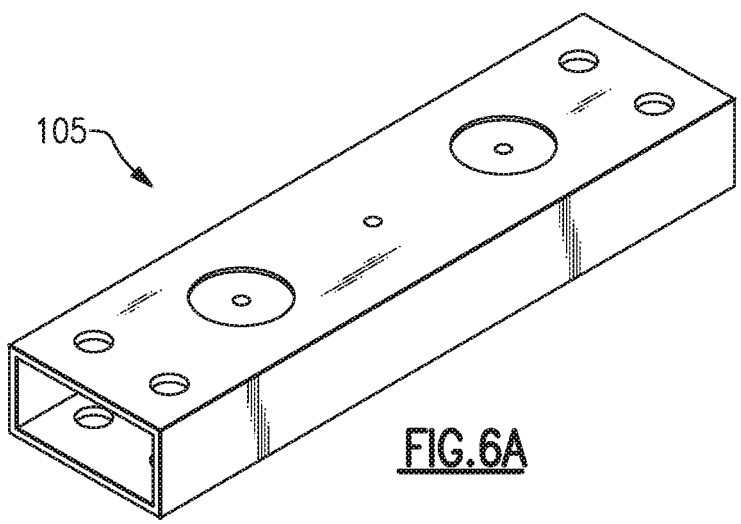
FIG. 6A is top isometric view of a waveguide body of the microwave cavity assembly of FIG. 2.
Figure 6B:
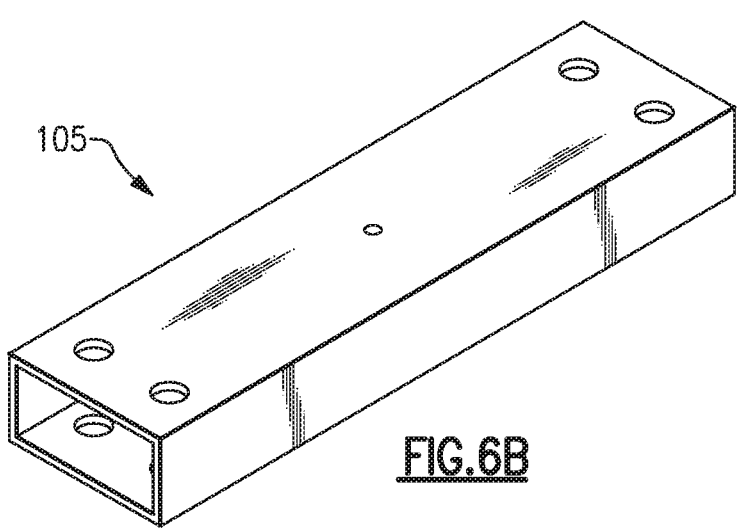
FIG. 6B is an bottom isometric view of the waveguide body of the microwave cavity assembly of FIG. 2.

An example of a waveguide assembly for permittivity measurements by the perturbation method is illustrated in isometric view in FIG. 2, in plan view from the top in FIG. 3, in cross-sectional view in FIG. 4, and in plan view from the bottom in FIG. 5. The waveguide assembly 100 includes a waveguide body 105. The waveguide body 105 is illustrated separately in a top isometric view in FIG. 6A and a bottom isometric view in FIG. 6B. The waveguide body 105 may have a rectangular cross section having constant dimensions along its length and having planar walls.

Figure 7:
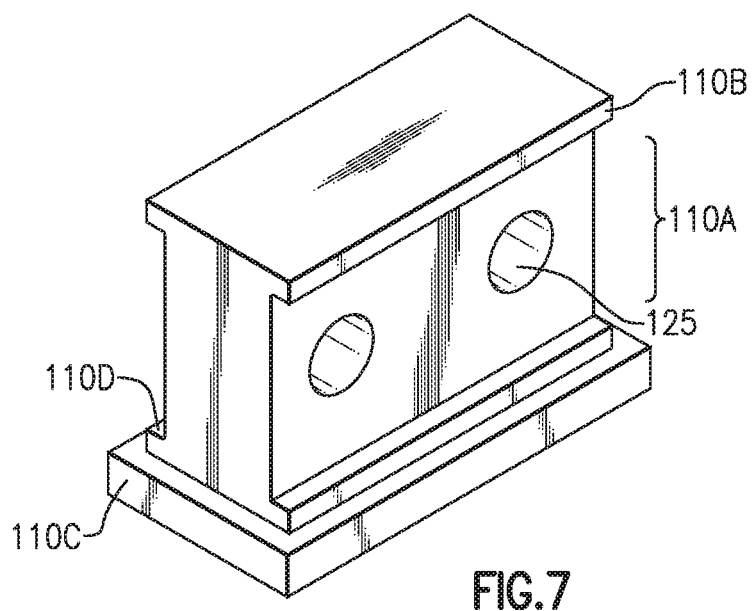
FIG. 7 is an isometric view of a shorting plug of the microwave cavity assembly of FIG. 2.

The ends of the waveguide body 105 may be sealed with shorting plugs 110. The shorting plugs 110 extend into the waveguide body 105 and are secured in place by bolts 115 and nuts 120, although in other embodiments, different fasteners may be utilized to secure the shorting plugs 110 in the waveguide body 105. An example of one of the shorting plugs 110 is illustrated in isometric view in FIG. 7. The shorting plugs 110 include apertures 125 through which the bolts 115 may pass. The apertures 125 may be disposed within a reduced height portion 110A of the shorting plugs. As illustrated in FIG. 4, these reduced height portions 110A provide for spacings 130 to be defined between the shorting plugs 110 and walls of the waveguide body 105 when the shorting plugs 110 are disposed within the waveguide body 105. These spacings 130 provide for the walls of the waveguide body 105 to be deflected inward when the bolts 115 and nuts 120 are tightened which causes a force to be exerted onto the lips 110B of the shorting plug 110 by the walls of the waveguide body 105 to ensure secure mechanical and electrical connection between the lips 110B of the shorting plug 110 and the walls of the waveguide body 105. The lips 110B of the shorting plug 110 create a short circuit between the walls of the waveguide body 105 where the waveguide body 105 contacts the lips 110B of the shorting plug 110. Shoulder portion 110C limits the degree to which the shorting body 110 may be inserted into the waveguide body 105 and remains outside of the waveguide body 105 when the shorting plug 110 is installed in the waveguide body 105. Secondary lips 110D may be provided abutting shoulder portion 110C and reduced height portions 110A. Together, the internal walls of the waveguide body 105 and the internal faces of the shorting plugs 110 disposed within the waveguide body 105 define a resonant chamber or microwave cavity 150 within the waveguide assembly 100.

Figure 8:
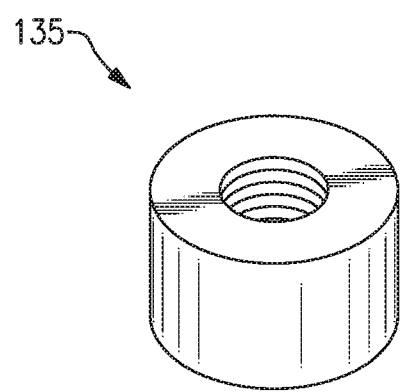
FIG. 8 is an isometric view of a threaded connector of the microwave cavity assembly of FIG. 2.

Internally threaded connector mounts 135 are affixed, for example, by soldering or welding, to the upper wall 105A of the waveguide body 105. In alternate embodiments, one of the connector mounts 135 may be affixed to the upper wall 105A of the waveguide body 105 and a second of the connector mounts 135 may be affixed to the lower wall 105B of the waveguide body 105, however, affixing both connector mounts 135 to the same wall may provide for easier access to the connector mounts 135 by a user. An example of a threaded connector mount 135 is illustrated in isometric view in FIG. 8. Threaded connector mounts 135 have threaded internal bores sized to receive male ends of Sub-Miniature version A (SMA) connectors 140. Female ends of the SMA connectors 140 extend outward from the threaded connector mounts 135, as illustrated in FIGS. 2 and 4. The SMA connectors 140 are used to electrically couple the waveguide assembly 100 to a source of microwave energy and a measurement instrument, for example, a VNA, via adjustable electrical probes fitted with SMA male connectors. The SMA connectors 140 may be threaded into and out of the threaded connector mounts 135 to adjust a degree of electrical coupling between the SMA connectors 140 and the waveguide assembly 100. The degree of coupling between the connectors 140 and the waveguide assembly 100 increases as the SMA connectors 140 are screwed further into the threaded connector mounts 135 and diminishes as the SMA connectors 140 are screwed out from the threaded connector mounts 135. Lock nuts 155 (See FIG. 9) or other locking fasteners may be used to hold the SMA connectors 140 in place in the threaded connector mounts 135. The inner conductors of the SMA connectors 140 are illustrated as extending slightly into the microwave cavity 150 in FIG. 4, but in some embodiments, during operation the electrical probes (the SMA connectors) do not enter the cavity interior, but rather sample the internal electric field by proximity.

Apertures 145 are defined in the upper wall 105A and lower wall 105B of the waveguide body 105. Apertures 145 are used to retain a sample for testing in the waveguide assembly 100. Apertures 145 may be centered in the upper wall 105A and lower wall 105B.

The assembled waveguide assembly 100 may have a length L of about 4.03 inches, a width W of about 1 inch, and a height H of about 0.5 inches. The dimensions of the waveguide body 105 and/or waveguide assembly 100 may vary based on a frequency of microwave energy that a user desires to excite within the waveguide body 105. For example, for waveguide assemblies designed to operate with excitation energy at a frequency of about 9.36 GHz, the waveguide body dimensions L1 and L2 illustrated in FIG. 4 may be 0.438 inches and 0.877 inches, respectfully (L2=2× L1). These dimensions provide for the microwave cavity 150 defined within the waveguide body 105 to be a resonant cavity supporting a third harmonic standing wave with electric field energy minimums at the innermost faces of the shorting plugs 110 and electric field energy maximums at lengths along the waveguide body 105 corresponding to the centers of the threaded connector mounts 135 and the apertures 145.

Figure 9:
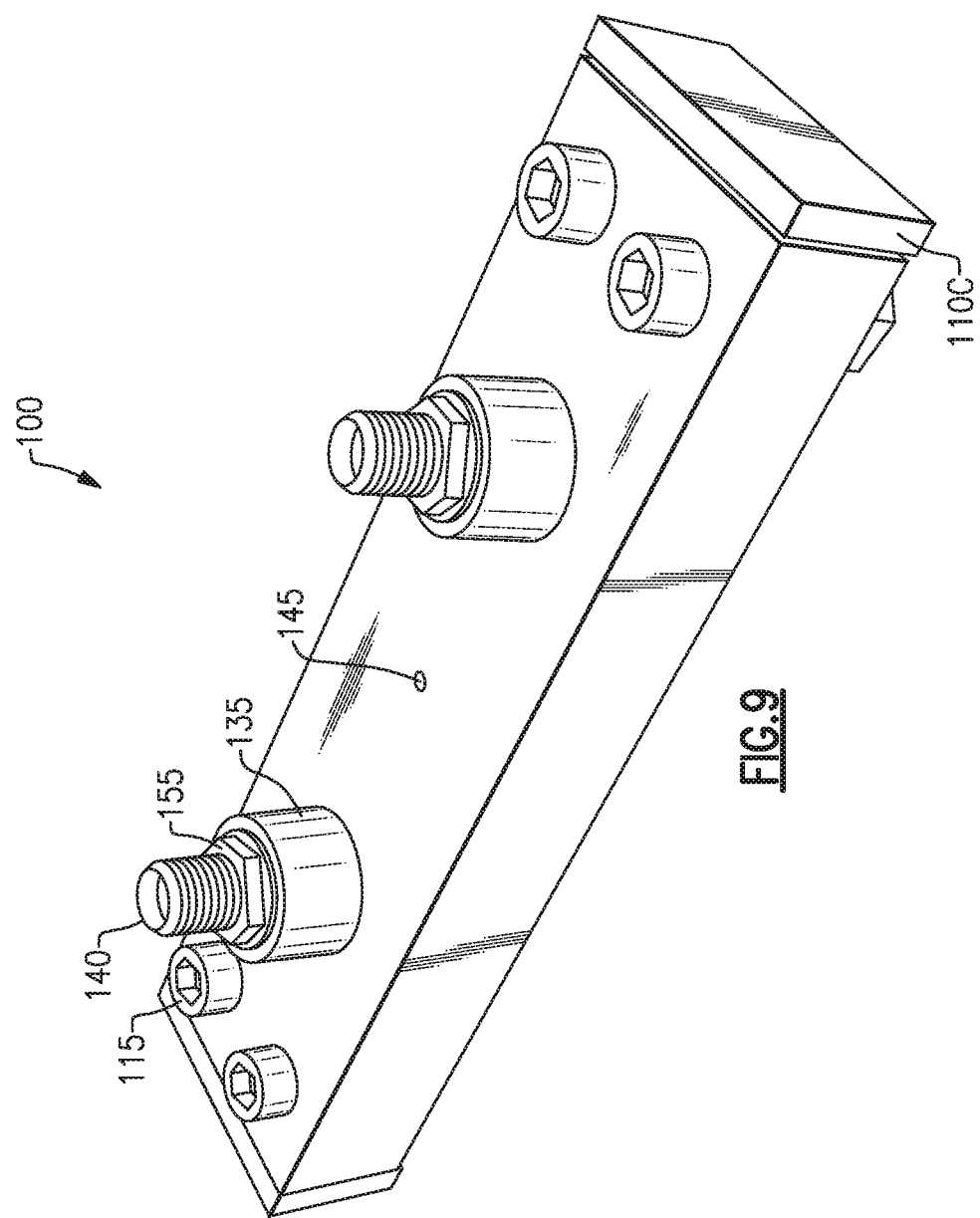
FIG. 9 is an image of an example of an assembled microwave cavity assembly in accordance with the present disclosure.

The components of embodiments of the waveguide assembly 100 are formed from conductive materials. For example, the waveguide body 105 may be formed from copper. The shorting plugs 110 and threaded connector mounts 135 may be brass. The SMA connectors 140 may be gold plated. The waveguide body 105, shorting plugs 110, and threaded connector mounts 135, or at least the portions of these components which define the microwave cavity 150 may be silver plated. One or more of these components may be silver plated prior to assembly of the waveguide body 105, shorting plugs 110, and/or threaded connector mounts 135 into the completed waveguide assembly 100 or, in other embodiments, the waveguide assembly 100 may be silver plated after joining of one or more of the components thereof. An example of a completed silver plated waveguide assembly 100 is illustrated in FIG. 9. In FIG. 9, the lock nuts 155 that hold the SMA connectors 140 in place in the threaded connector mounts 135 are visible.

Embodiments of the disclosed waveguide assembly 100 may be utilized to measure the electrical permittivity of a rod-shaped sample. The method may involve first measuring the Q value and resonant frequency of the waveguide assembly without the sample disposed in the waveguide assembly. The sample may then be secured in the waveguide assembly via the apertures 145 and the Q value and resonant frequency of the waveguide assembly with the sample disposed therein may be measured. The electrical permittivity of the sample may be determined from the difference in Q value and resonant frequency in the test performed with the sample disposed in the waveguide assembly and the test performed without the sample disposed in the waveguide assembly. The electrical permittivity of the sample may be determined from the procedures and equations set disclosed in ASTM D2520-13—"Standard Test Methods for Complex Permittivity (Dielectric Constant) of Solid Electrical Insulating Materials at Microwave Frequencies and Temperatures to 165° C."

EXAMPLE

The performance of the waveguide assembly illustrated in FIG. 9 was compared to that of the waveguide assembly illustrated in FIG. 2. Each waveguide assembly was connected to a Hewlett Packard Model 6722D Vector Network Analyzer and driven with a microwave signal at 9.36 GHz. The improved waveguide assembly illustrated in FIG. 9 exhibited a loaded Q of 7149.9 with a −31.4 dB loss which yields an unloaded Q value ($Q_u$) of 7,348. The conventional waveguide assembly illustrated in FIG. 2 exhibited a Q value of 4990 with a −27.5 dB loss. The improved waveguide assembly thus exhibited a 43% increase in cavity Q indicating that the improved waveguide assembly is capable of providing improved sample measurement accuracy as opposed to the previously utilized waveguide assembly.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Directional terms such as "above," below," "left," "right," etc. are used herein as a matter of convenience for referencing various surfaces and orientations of features disclosed herein. There directional terms do not imply that the aspects and embodiments disclosed herein are necessarily oriented in any particular orientation. Any dimensions provided in the above disclosure are meant as examples only and are not intended to be limiting.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while acts of the disclosed processes are presented in a given order, alternative embodiments may perform routines having acts performed in a different order, and some processes or acts may be deleted, moved, added, subdivided, combined, and/or modified. Each of these processes or acts may be implemented in a variety of different ways. Also, while processes or acts are at times shown as being performed in series, these processes or acts may instead be performed in parallel, or may be performed at different times.

The teachings of the invention provided herein can be applied to other systems, not necessarily the system described above. The elements and acts of the various embodiments described above can be combined to provide further embodiments.

What is claimed is:

1. An apparatus for perturbation method electrical permittivity measurements of a sample, the apparatus comprising:
    a waveguide body having a first end, a second end, an upper wall, and a lower wall;
    a first shorting plug disposed within the waveguide body proximate the first end;
    a second shorting plug disposed within the waveguide body proximate the second end;
    a first threaded connector mount attached to the upper wall of the waveguide body at a first position along a length of the waveguide body;
    a second threaded connector mount attached to the upper wall of the waveguide body at a second position along the length of the waveguide body; and
    first and second apertures formed centrally in the upper wall and lower wall, respectively, of the waveguide body, the waveguide body and the first and second shorting plugs defining a resonant cavity within the waveguide body, the resonant cavity sized and shaped to support a third harmonic standing wave having electric field energy minimums at end faces of the shorting plugs and electric field energy maximums at positions within the waveguide body corresponding to the first threaded connector mount, the second threaded connector mount, and the first and second apertures.

2. The apparatus of claim 1 wherein the first and second shorting plugs include shoulder portions extending outward from an internal region of the waveguide body and abutting against the first and second ends, respectively, of the waveguide body.

3. The apparatus of claim 2 wherein the first and second shorting plugs include end faces including first outwardly protruding lips, second outwardly protruding lips abutting the shoulder portions, and reduced height portions defined between the first outwardly protruding lips and second outwardly protruding lips.

4. The apparatus of claim 3 wherein the first and second shorting plugs include apertures defined in the reduced height portions sized to receive bolts to hold the first and second shorting plugs in place in the waveguide body.

5. The apparatus of claim 1 wherein the first and second threaded connector mounts are configured to receive and retain SubMiniature version A (SMA) male connectors.

6. The apparatus of claim 5 further comprising locking nuts configured to maintain the SMA male connectors in place within the first and second threaded connector mounts.

7. The apparatus of claim 6 wherein rotation of the SMA male connectors within the first and second threaded connector mounts causes the SMA male connectors to be displaced within the first and second threaded connector mounts, displacement of the SMA male connectors within the first and second threaded connector mounts altering a cavity insertion loss of the SMA male connectors.

8. The apparatus of claim 1 wherein the waveguide body is formed of copper.

9. The apparatus of claim 8 wherein the first and second shorting plugs are formed of brass.

10. The apparatus of claim 9 wherein the first and second threaded connector mounts are formed of brass.

11. The apparatus of claim 10 wherein surfaces of a resonant cavity defined by internal walls of the waveguide body and end faces of the first and second shorting plugs are silver plated.

12. The apparatus of claim 1 wherein the waveguide body has a rectangular cross section.

13. The apparatus of claim 1 having a quality factor of above 7,000 at 9.36 GHz.

14. A method for measuring the electrical permittivity of a sample, the method comprising:
   measuring a quality factor (Q value) and resonant frequency of an empty waveguide assembly, the waveguide assembly including a waveguide body having a first end, a second end, an upper wall, and a lower wall, a first shorting plug disposed within the waveguide body proximate the first end, a second shorting plug disposed within the waveguide body proximate the second end, a first threaded connector mount attached to the upper wall of the waveguide body at a first position along a length of the waveguide body, a second threaded connector mount attached to the upper wall of the waveguide body at a second position along the length of the waveguide body, and first and second apertures formed centrally in the upper wall and lower wall, respectively, of the waveguide body;
   inserting at least a portion of the sample through one or both of the first and second apertures and into an internal volume of the waveguide body;
   measuring the Q value and resonant frequency of the waveguide assembly with the sample disposed therein; and
   calculating the electrical permittivity of the sample from the Q value and resonant frequency of the empty waveguide assembly and the Q value and resonant frequency of the waveguide assembly with the sample disposed therein.

15. The method of claim 14 further comprising mounting a first electrical connector in the first threaded connector mount and mounting a second electrical connector in the second threaded connector mount.

16. The method of claim 15 further comprising adjusting a degree of electrical coupling between the first and second electrical connectors and the waveguide assembly by adjusting a degree to which the first and second electrical connectors are screwed into the first threaded connector mount and second threaded connector mount, respectively.

17. The method of claim 16 further comprising locking the first and second electrical connectors in place in the first threaded connector mount and second threaded connector mount, respectively with lock nuts.

18. The method of claim 15 wherein measuring the Q value and resonant frequency of the waveguide assembly includes introducing microwave energy into the waveguide assembly via the first and second electrical connectors.

19. The method of claim 18 further comprising selecting a frequency of the microwave energy that creates a third harmonic standing wave with electric field energy minimums at innermost faces of the shorting plugs and electric field energy maximums at lengths along the waveguide body corresponding to centers of the first and second threaded connector mounts and the first and second apertures.

20. An apparatus for perturbation method electrical permittivity measurements of a sample, the apparatus comprising:
   a waveguide body having a first end, a second end, an upper wall, and a lower wall;
   a first shorting plug disposed within the waveguide body proximate the first end;
   a second shorting plug disposed within the waveguide body proximate the second end, the first and second shorting plugs include end faces having first outwardly protruding lips, second outwardly protruding lips, reduced height portions defined between the first outwardly protruding lips and second outwardly protruding lips, and apertures defined in the reduced height portions;
   a first threaded connector mount attached to the upper wall of the waveguide body at a first position along a length of the waveguide body;
   a second threaded connector mount attached to the upper wall of the waveguide body at a second position along the length of the waveguide body;
   first and second apertures formed centrally in the upper wall and lower wall, respectively, of the waveguide body; and
   bolts passing through the upper wall, the apertures in the first and second shorting plugs, and the lower wall, the bolts holding the first and second shorting plugs in place in the waveguide body.

* * * * *